United States Patent
Deng (10) Patent No.: US 10,062,572 B2
(45) Date of Patent: Aug. 28, 2018

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Wu Feng Deng, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/476,249

(22) Filed: Mar. 31, 2017

(65) Prior Publication Data

US 2017/0294315 A1 Oct. 12, 2017

(30) Foreign Application Priority Data

Apr. 7, 2016 (CN) .......................... 2016 1 0213621

(51) Int. Cl.
*H01L 21/4763* (2006.01)
*H01L 21/28* (2006.01)
(Continued)

(52) U.S. Cl.
CPC .. *H01L 21/28123* (2013.01); *H01L 21/28088* (2013.01); *H01L 21/3212* (2013.01); *H01L 29/4966* (2013.01)

(58) Field of Classification Search
CPC ......... H01L 21/28088; H01L 21/28123; H01L 21/3212; H01L 29/4966
See application file for complete search history.

(56) References Cited

U.S. PATENT DOCUMENTS

| 5,200,030 A | 4/1993 | Cho et al. |
| 6,287,963 B1 | 9/2001 | Chen et al. |

(Continued)

FOREIGN PATENT DOCUMENTS

| EP | 0799903 A2 | 10/1997 |
| JP | 2005116592 A | 4/2005 |

OTHER PUBLICATIONS

The European Patent Office (EPO) The Extended European Search Report for 17163839.8 dated Sep. 28, 2017 9 Pages.

*Primary Examiner* — Robert Bachner
(74) *Attorney, Agent, or Firm* — Anova Law Group, PLLC (57) ABSTRACT

A method is provided for fabricating a semiconductor structure. The method includes providing a substrate having a dielectric layer formed on the substrate, where an opening is formed in the dielectric layer, and bottom of the opening exposes surface of the substrate. The method also includes forming a first metal layer over of the dielectric layer, where a temperature for forming the first metal layer is a first temperature. In addition, the method includes forming a second metal layer filling the opening, where a temperature for forming the second metal layer is a second temperature, and the second temperature is higher than the first temperature. Further, the method includes planarizing the second metal layer and the first metal layer until the top surface of the dielectric layer is exposed.

20 Claims, 6 Drawing Sheets

(51) Int. Cl.
*H01L 21/321* (2006.01)
*H01L 29/49* (2006.01)

(56) References Cited

U.S. PATENT DOCUMENTS

| | | | |
|---|---|---|---|
| 2003/0186539 A1 | 10/2003 | Lee et al. | |
| 2009/0229667 A1* | 9/2009 | Shrotriya | H01L 51/445 |
| | | | 136/263 |
| 2012/0164923 A1* | 6/2012 | Jiang | B24B 53/017 |
| | | | 451/56 |
| 2012/0326243 A1 | 12/2012 | Huang et al. | |
| 2013/0001706 A1* | 1/2013 | Haran | H01L 21/84 |
| | | | 257/410 |
| 2013/0037865 A1 | 2/2013 | Nogami et al. | |
| 2013/0193577 A1* | 8/2013 | Tseng | H01L 23/485 |
| | | | 257/751 |
| 2013/0302974 A1* | 11/2013 | Hahn | H01L 21/823842 |
| | | | 438/585 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201610213621.7, filed on Apr. 7, 2016, the entirety of which is incorporated herein by reference.

FIELD OF THE INVENTION

The present invention generally relates to the field of semiconductor manufacturing and, more particularly, relates to a semiconductor structure and fabrication techniques thereof.

BACKGROUND

With the rapid development of ultra-large-scale integration, the fabrication process of integrated circuits becomes more and more complex and sophisticated. To improve integration degree and to reduce manufacturing cost, the number of semiconductor components per unit area in the chip increases. Planar wiring has been difficult to meet the demand of high-density distribution of semiconductor components. Multi-layer wiring technology is performed to use vertical space of the chip to further improve the integration degree of the devices. However, using the multi-layer wiring technology can cause rough surface of the silicon wafer, which may affect patterning processes. Therefore, to realize the multi-layer wiring structure, each layer of the semiconductor structure first needs to have a high level of flatness; and the semiconductor structures on the wafer also need to be planarized.

A chemical mechanical polishing (CMP) process is one of the most common planarization processes. The planarization efficiency of the chemical mechanical polishing process is high, and CMP process has become an indispensable semiconductor process technology.

However, after performing the planarization process onto semiconductor structures formed by existing fabrication techniques, the wafer surface is prone to scratches. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a substrate having a dielectric layer formed on the substrate, wherein an opening is formed in the dielectric layer, and bottom of the opening exposes surface of the substrate. The method also includes forming a first metal layer over of the dielectric layer, wherein a temperature for forming the first metal layer is a first temperature. In addition, the method includes forming a second metal layer filling the opening, wherein a temperature for forming the second metal layer is a second temperature, and the second temperature is higher than the first temperature. Further, the method includes planarizing the second metal layer and the first metal layer until the top surface of the dielectric layer is exposed.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the alike parts.

Figure 1:
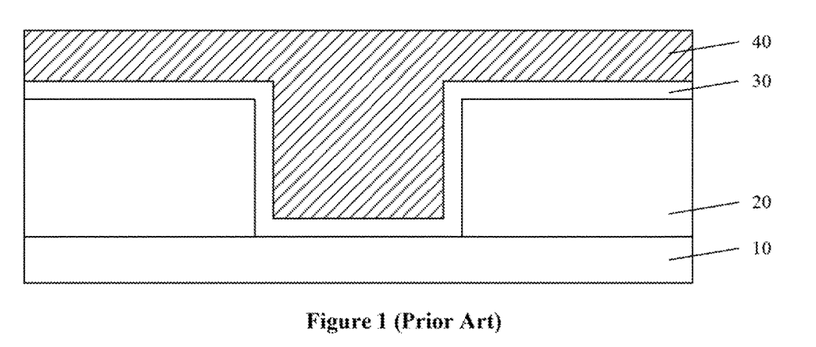
FIGS. 1-2 illustrate cross-sectional views of semiconductor structures corresponding to certain stages of an existing fabrication process of a semiconductor structure.
Figure 2:
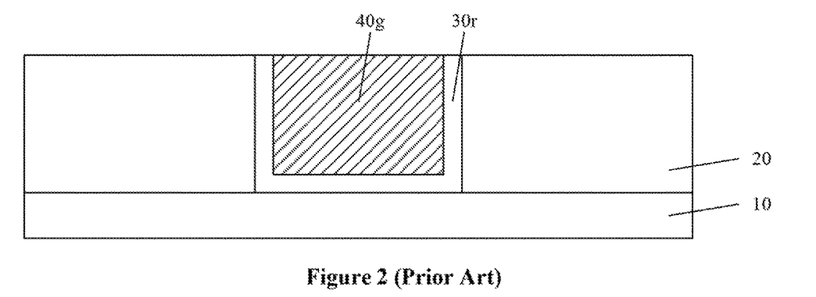

FIGS. 1-2 illustrate cross-sectional views of semiconductor structures corresponding to certain stages of an existing fabrication process of a semiconductor structure. A fabrication process to form a metal gate structure is described as an example.

As shown in FIG. 1, the fabrication process includes providing a substrate 10, forming a dielectric layer 20 on the substrate 10, and forming an opening in the dielectric layer 20. The fabrication process also includes forming a liner material layer 30, where the liner material layer 30 covers the bottom and side surfaces of the opening and the top surface of the dielectric layer 20; and forming a metal layer 40, where the metal layer 40 fills the opening and covers the liner material layer 30 formed on the top surface of the dielectric layer 20.

As shown in FIG. 2, further, the existing fabrication process includes forming a metal gate 40g and a liner layer 30r by planarizing the metal layer 40 to remove the metal layer 40 and the liner material layer 30 formed on the top surface of the dielectric layer 20. The top surfaces of the metal gate 40g, the liner layer Or and the dielectric layer 20 are flush.

In the existing techniques, the metal layer 40 is formed by a film deposition process at one time, and temperature in the process of forming the metal layer 40 is high. When the metal layer 40 is made of aluminum, the temperature of forming the metal layer 40 is approximately 430° C. Therefore, the density of the formed metal layer 40 is small. That is, the metal layer 40 is not cot pact enough, thus the strength of the metal layer 40 is small. During forming the metal gate 40g, it is easy to form metal fragments or particles. During the planarization process, the metal fragments or particles tend to scratch the wafer surface, thus resulting in scratches on the wafer surface, and impacting improving the flatness of the wafer surface.

Figure 7:
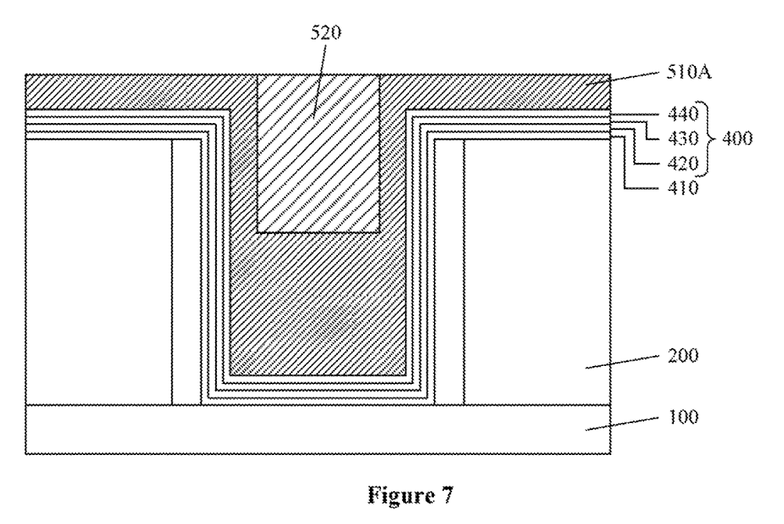
Figure 8:
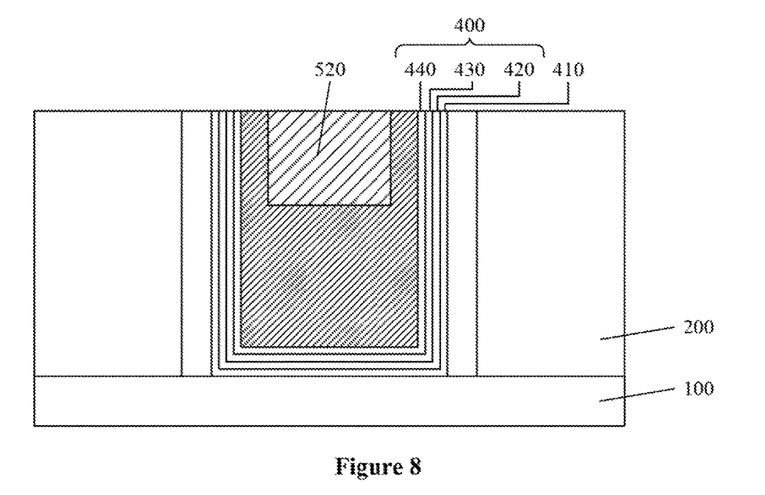
Figure 9:
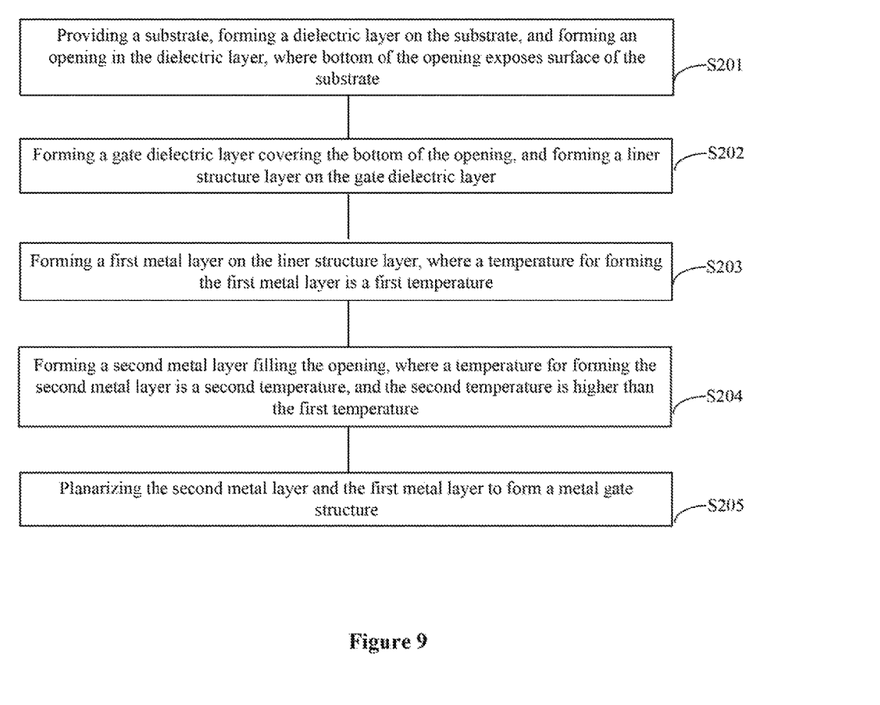
FIG. 9 illustrates an exemplary fabrication process to form a semiconductor structure consistent with the disclosed embodiments.

The present disclosure provides an improved semiconductor structure and fabrication process. FIG. 9 illustrates an exemplary fabrication process to form a semiconductor structure consistent with the disclosed embodiments; and FIGS. 3-8 illustrate cross-sectional views of semiconductor structures corresponding to certain stages of the exemplary fabrication process. In one embodiment, a fabrication process to form a metal gate structure is described as an example. In certain other embodiments, the disclosed embodiments can also be configured to form a metal plug, metal interconnect lines, and other semiconductor structures.

Figure 3:
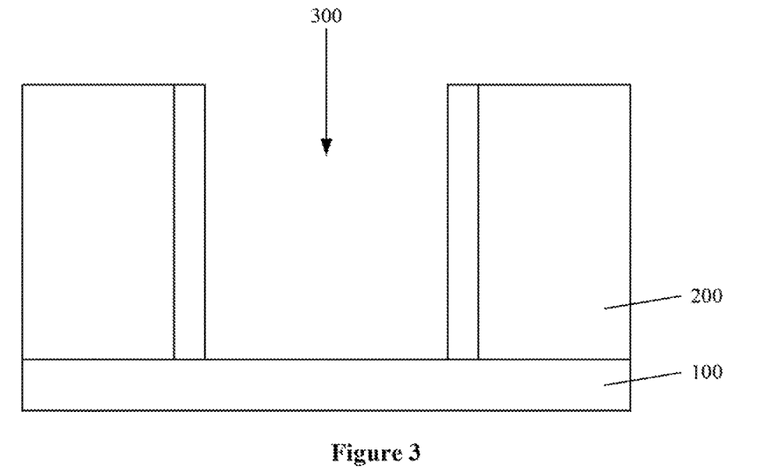
FIGS. 3-8 illustrate cross-sectional views of semiconductor structures corresponding to certain stages of a fabrication process of a semiconductor structure consistent with the disclosed embodiments.

As shown in FIG. 9, at the beginning of the fabrication process, a substrate with certain structures may be provided (S201). FIG. 3 illustrates a corresponding semiconductor structure.

Referring to FIG. 3, a substrate 100 may be provided, a dielectric layer 200 may be formed on the substrate 100, and an opening 100 may be formed in the dielectric layer 200. Bottom of the opening 300 may expose the surface of the substrate 100.

The substrate 100 may be configured as a platform for subsequent fabrication processes. The substrate 100 may include monocrystalline silicon, polycrystalline silicon, amorphous silicon. The substrate 100 may also include silicon (Si), germanium (Ge), germanium-silicon alloy (GeSi), or gallium arsenide (GaAs) and other compounds. In addition, the substrate 100 may include other semiconductor materials. Further, the substrate 100 may include a silicon material having an epitaxial layer or on an epitaxial layer. In one embodiment, a gate structure for forming a planar transistor is described as an example, therefore, the substrate 100 may be a monocrystalline silicon substrate.

The dielectric layer 200 may be formed to provide electrical isolation between different semiconductor devices, and may also be configured to define the shape and dimensions of subsequently formed gate. The opening 300 may be formed in the dielectric layer 200. A metal gate structure may be subsequently formed by filling the opening 300 with metal material. Specifically, in one embodiment, the dielectric layer 200 may be made of silicon oxide.

Forming the dielectric layer 200 may include: forming a dielectric material layer on the substrate 100 by a chemical vapor deposition process, a physical vapor deposition process, an atomic layer deposition process, or other film deposition processes; forming a patterned layer on the dielectric material layer; and using the patterned layer as a mask to etch the dielectric material layer until the surface of the substrate 100 is exposed to form the opening 300.

The patterned layer may be a patterned photoresist layer, and may be formed by coating and photolithography processes. In addition, to decrease the dimensions of the subsequently formed metal gate structure, and to decrease the dimensions of the semiconductor device, the patterned layer may be formed by a multiple patterned mask process. The multiple patterned mask process may include a self-aligned double patterned (SaDP) process, a self aligned triple patterned (SaTP) process, or a self-aligned double double patterned (SaDDP) process, etc.

In one embodiment, the opening 300 may be formed by etching the dielectric layer 200. In certain other embodiments, the opening may also be formed by removing the dummy gate thrilled in the dielectric layer, and other processes may also be used.

To prevent damages to the formed channel region of the semiconductor device caused by the subsequent semiconductor processes, and to reduce occurrence of source-drain punch-through phenomenon, a gate sidewall spacer may be formed on the side wall of the opening 300 (not labeled). The gate sidewall spacer may be made of nitride, or oxide, etc. In one embodiment, the gate sidewall spacer may be made of silicon nitride.

Specifically, forming the gate sidewall spacer may include: forming a sidewall spacer material layer covering the top surface of the dielectric layer 200 and the bottom and side surfaces of the opening 300 by a chemical vapor deposition process, a physical vapor deposition process, an atomic layer deposition process, or other film deposition processes; and then performing an anisotropic dry etching process to remove the sidewall spacer material layer on the top surface of the dielectric layer 200 and the bottom of the opening 300 until the top surface of the dielectric layer 200 and the bottom of the opening 300 are exposed. The sidewall spacer material layer on the side surface of the opening 300 may be retained to form the gate sidewall spacer.

Figure 4:
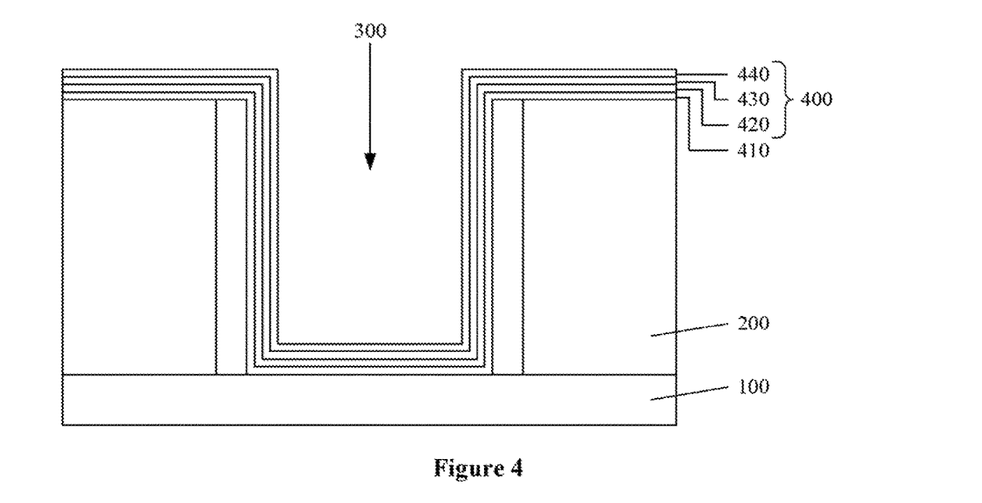

Returning to FIG. 9, after providing the substrate having certain structures, a gate dielectric layer and a liner structure layer may be formed (S202). FIG. 4 illustrates a corresponding semiconductor structure.

As shown in FIG. 4, a gate dielectric layer 410 may be formed. The gate dielectric layer 410 may cover the bottom and side surfaces of the opening 300.

The gate dielectric layer 410 may be made of oxide, or high-K materials, such as silicon oxide, hafnium oxide, zirconium oxide, hafnium silicon oxide, lanthanum oxide, silica, zirconium oxide, titanium oxide, tantalum oxide, barium strontium titanium, barium titanium oxide, strontium titanium oxide, or alumina oxide, etc.

After forming the gate dielectric layer 410 and before forming a first metal layer over the gate dielectric layer 410, the fabrication process may also include forming a liner structure layer 400 on the gate dielectric layer 410.

Along a direction away from the substrate 100, the liner structure layer 400 may include a barrier layer 420, a work function layer 430, and an adhesive layer 440. Other layers may also be included.

Specifically, the liner structure layer 400 may be sequentially formed on the gate dielectric layer 410 by a chemical vapor deposition process, a physical vapor deposition process, an atomic layer deposition process, or other film deposition processes.

The barrier layer 420 may be configured to prevent diffusion of metal ions in subsequently formed film structure and the metal gate structure, which impacts the insulating property of the gate dielectric layer 410 and the performance of the channel in the substrate 100. In addition, the barrier layer 420 may be configured to stop etching during the subsequent planarization process. The barrier layer 420 may be made of titanium nitride, or tantalum nitride, etc. Specifically, the barrier layer 420 may be formed on the gate dielectric layer 410 over the top surface of the dielectric layer 200 and the bottom and side surfaces of the opening 300 by a chemical vapor deposition process, a physical vapor deposition process, or an atomic layer deposition process, etc. In one embodiment, the barrier layer 420 may include a tantalum nitride layer.

The work function layer 430 may be configured to adjust the work function of the formed gate structure, and to adjust threshold voltage of the formed semiconductor device. Specifically, in one embodiment, the gate structure may be made of a PMOS device. Therefore, the work function layer 430 may include a titanium aluminum layer, an aluminum nitride layer, and a titanium layer. By adjusting the thicknesses of the titanium aluminum layer, the aluminum nitride layer, and the titanium layer, the function of adjusting the work function of the formed gate structure may be achieved.

The adhesive layer 440 may be configured to improve the connection strength between the metal material and the liner structure layer 400. Specifically, the material of the adhesive layer 440 may be the same as the material of the subsequently formed first metal layer. In one embodiment, the adhesive layer 440 may include an aluminum seed layer formed by a chemical vapor deposition process, and an aluminum layer formed by a physical vapor deposition process.

Figure 5:
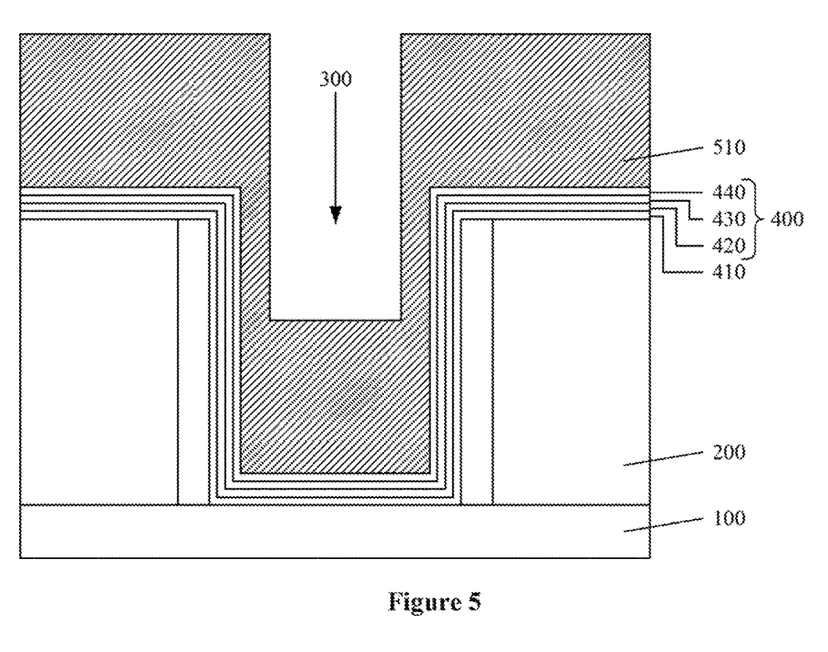

Returning to FIG. 9, after forming the gate dielectric layer and the liner structure layer, a first metal layer may be formed (S203). FIG. 5 illustrates a corresponding semiconductor structure.

As shown in FIG. 5, a first metal layer 510 may be formed on the liner structure layer 400 over the top surface of the dielectric layer 200. In certain embodiments, the liner structure layer 400 may be omitted, and the first metal layer 510 may be formed on the top surface of the dielectric layer 200. In certain other embodiments, other intermediate layer(s) may also be formed between the first metal layer 510 and the dielectric layer 200.

The first metal layer 510 may cover the top surface of the liner structure layer 400, and protect the liner structure layer 400 from damages caused by the subsequent planarization process. Specifically, in one embodiment, the first metal layer 510 may be made of aluminum and formed by a physical vapor deposition process.

The temperature for forming the first metal layer 510 may be the first temperature. Specifically, the first temperature may be in a range of approximately 300-350° C. Compared to the temperature for forming aluminum gate by the existing techniques, the first temperature is lower. Therefore, the first metal layer 510 may have more compact structure, smaller grains, and stronger strength.

If the thickness of the first metal layer 510 is too small, it is difficult to protect the liner structure layer 400 during the subsequent planarization process. Therefore, in one embodiment, the thickness of the first metal layer 510 may be above 300 Å.

In addition, because the temperature for forming the first metal layer 510 is low, the first metal layer 510 may have more complete crystal structure and fewer defects. In one embodiment, the first metal layer 510 may also cover the liner structure layer 400 over the bottom of the opening 300 to improve the performance of interface between subsequently formed second metal layer and the liner structure layer 400, and to improve the lattice mismatch issue. Similar to the existing techniques, the first metal layer 510 may also cover the liner structure layer 400 over the side surface of the opening 300 (not labeled).

Figure 6:
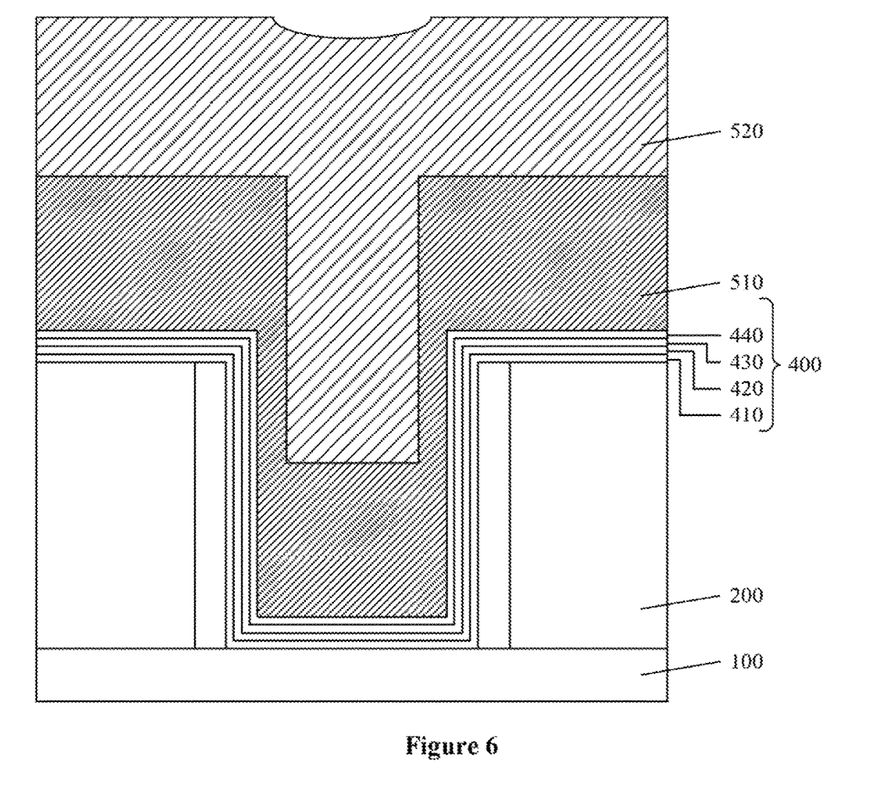

Returning to FIG. 9, after forming the first metal layer, a second metal layer may be formed (S204). FIG. 6 illustrates a corresponding semiconductor structure.

As shown in FIG. 6, a second metal layer 520 may be formed. The second metal layer 520 may be configured to fill the opening 300 (shown in FIG. 5) to form a metal gate structure. Specifically, in one embodiment, the metal gate structure may be an aluminum gate. Therefore, both the second metal layer 520 and the first metal layer 510 may be made of the same material, aluminum. The second metal layer 520 may be formed in the opening 300 by a physical vapor deposition process.

In one embodiment, the first metal layer 510 may also cover the liner structure layer 400 over the bottom of the opening 300 (shown in FIG. 5). Therefore, the formed metal gate structure may include the first metal layer 510 and the second metal layer 520 filling the opening 300.

The temperature for forming the second metal layer 520 may be the second temperature. The second temperature may be higher than the first temperature. Therefore, compared to the first metal layer 510 formed at the first temperature, the second metal layer 520 may have a higher conductivity and better electrical performance, and may improve the electrical performance of the formed metal gate structure. Specifically, the second temperature may be in a range of approximately 400-450° C. In one embodiment, the second metal layer 520 may be made of aluminum, and the second temperature may be approximately 430° C.

Further, the second metal layer 520 may be formed on the first metal layer 510. The first metal layer 510 may have lower formation temperature and fewer structural defects. Compared to the metal gate structure directly formed at a high temperature in the existing techniques, the second metal layer 520 may have smaller grains and greater hardness.

If the thickness of the second metal layer 520 is too small, it is difficult to sufficiently fill the opening 300 (shown in FIG. 5), thus impacting the electrical performance of the formed metal gate structure. If the thickness of the second metal layer 520 is too large, it is easy to waste materials and to increase the fabrication difficulty. In one embodiment, the thickness of the second metal layer 520 may be in a range of approximately 2000-5000 Å.

To ensure the second metal layer 520 completely fill the opening 300 (shown in FIG. 5), in one embodiment, the second metal layer 520 may also be formed over the dielectric layer 200. In other words, the second metal layer 520 may also cover part of the first metal layer 510 over the dielectric layer 200.

Returning to FIG. 9, after forming the second metal layer, a metal gate structure may be formed by planarizing the second metal layer and the first metal layer (S205). FIGS. 7-8 illustrate corresponding semiconductor structures.

As shown in FIGS. 7-8, a metal gate structure may be formed by planarizing the second metal layer and the first metal layer until the top surface of the dielectric layer 200 is exposed.

As shown in FIG. 7, the planarization process may include performing a first planarization process to remove the second metal layer 520 formed over the dielectric layer 200 (shown in FIG. 6).

Specifically, a chemical mechanical polishing process may be performed to remove the second metal layer 520 formed over the dielectric layer 200. To improve the efficiency of the planarization process and to shorten the time of forming the metal gate structure, in one embodiment, during performing the first planarization process by the chemical mechanical polishing process, the applied pressure may be greater than 1.5 Pa, and the hardness of polishing pad may be in a range of approximately 80-100 MPa.

Because of the buffering effect of the first metal layer 510, the second metal layer 520 may have even smaller grains and even greater hardness. Therefore, during the first planarization process, amount of the formed fragments may be small, which may effectively reduce the possibility of scratching the wafer surface, reduce scratches on the wafer surface, and improve the flatness of the wafer surface after the planarization process.

In one embodiment, to improve the speed of the planarization process, during performing the first planarization process, part of thickness of the first metal layer 510 over the dielectric layer 200 may also be removed, such that the thickness of the first metal layer 510 over the dielectric layer 200 may reach a preset thickness.

If the preset thickness is too small, the remaining first metal layer 510A may be difficult to protect the liner structure layer 400. If the preset thickness is too large, it may impact increasing the speed of the planarization process. Specifically, the preset distance may be in a range of approximately 300-1000 Å. Therefore, in one embodiment, during the first planarization process, the total thickness of removing the first metal layer 510 and the second metal layer 520 may be above 3000 Å.

As shown in FIG. 8, the planarization process may also include performing a second planarization process to remove the first metal layer 510 or the remaining first metal layer 510A over the dielectric layer 200 until the top surface of the liner structure layer 400 is exposed.

Specifically, the second planarization process may be performed by a chemical mechanical polishing process. The chemical mechanical polishing process may stop when the top surface of the liner structure layer 400 is exposed. In one embodiment, during performing the second planarization process by the chemical mechanical polishing process, the applied pressure may be in a range of approximately 1-2 Pa, and the hardness of the polishing pad may be in a range of approximately 20-40 MPa.

Because the temperature for forming the first metal layer 510 is low, the first metal layer 510 may have complete crystal structure, small grains and great hardness. Therefore, during the second planarization process, amount of the formed fragments may be small, which may effectively reduce scratches formed on the wafer surface, and improve the flatness of the wafer surface after the planarization process.

During the chemical mechanical polishing process, polishing liquid may be added. The polishing liquid may have an etching effect to improve the efficiency of the chemical mechanical polishing process. Therefore, the liner structure layer 400 may be configured to stop etching during the chemical mechanical polishing process, and to effectively protect the dielectric layer from effects of the second planarization process.

Further, as shown in FIG. 8, the planarization process may include performing a third planarization process until the top surface of the remaining second metal layer 520 and the top surface of the dielectric layer 200 are flush.

Specifically, the third planarization process may be performed by a chemical mechanical polishing process. In one embodiment, during performing the third planarization process by the chemical mechanical polishing process, the applied pressure may be in a range of approximately 1-2 Pa, and the hardness of the polishing pad may be in a range of approximately 20-40 MPa. Therefore, during the third planarization process, a polishing grinding process may be performed onto the wafer surface to improve the flatness of the wafer surface.

Since the first metal layer 510 may be formed over the bottom of the opening, the second metal layer 520 in the opening may have complete crystal structure, small grains and great hardness. During the third planarization process, amount of the formed fragments may be small, which may effectively reduce scratches formed on the wafer surface, and improve the flatness of the wafer surface after the planarization process.

The chemical mechanical polishing process may stop when the top surface of the dielectric layer 200 is exposed. Or the chemical mechanical polishing process may remove part of thickness of the dielectric layer 200 and the second metal layer 520, to ensure the liner structure layer 400 and the gate dielectric layer 410 formed on the dielectric layer 200 are thoroughly removed.

Specifically, in the existing techniques, the metal layer may be formed by a film deposition process at one time. After the planarization process, the reflectivity of the wafer surface may be 51.3%, and the roughness of the wafer surface may be 10.1%. In the disclosed embodiments, by forming the first metal layer at a low temperature before forming the second metal layer at a high temperature, after forming the metal gate structure by the planarization process, the reflectivity of the wafer surface may be 81.9%, and the roughness of the wafer surface may be 1.64%. Therefore, the disclosed embodiments may effectively improve the flatness of the wafer surface after the planarization process, improve the accuracy of the process, and improve manufacturing yield of the devices.

Accordingly, the first metal layer may be formed over the dielectric layer and the bottom of the opening. The second metal layer may be formed, filling the opening. The first metal layer may be formed at the first temperature, and the second metal layer may be formed at the second temperature. The second temperature may be higher than the first temperature. Therefore, the first metal layer may have complete crystal structure, small grains and great hardness. Because of the buffering effect of the first metal layer, the second metal layer may have even smaller grains and even greater hardness. Therefore, during the polishing process, amount of the formed fragments may be small, which may effectively reduce the possibility of scratching the wafer surface, to improve the flatness of the wafer surface after the planarization process.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate;
   forming a dielectric layer on the substrate, wherein an opening is formed in the dielectric layer, and bottom of the opening exposes a surface of the substrate;
   forming a metal gate in the opening by:
      forming a first metal layer over a top of the dielectric layer, wherein a temperature for forming the first metal layer is a first temperature, and
      forming a second metal layer filling the opening, wherein a temperature for forming the second metal layer is a second temperature, and the second temperature for forming the second metal layer is higher than the first temperature for forming the first metal layer, while the second metal layer and the first metal layer are made of a same material; and
   planarizing the second metal layer and the first metal layer until a top surface of the dielectric layer is exposed.

2. The method according to claim 1, wherein:
   the first temperature is in a range of approximately 300° C.-350° C., and
   the second temperature is in a range of approximately 400° C.-450° C.

3. The method according to claim 1, wherein:
   the first metal layer and the second metal layer are made of the same material including aluminum.

4. The method according to claim 1, wherein:
   a physical vapor deposition process is performed to form the first metal layer or the second metal layer.

5. The method according to claim 1, wherein:
   a thickness of the first metal layer is larger than 300 Å.

6. The method according to claim 1, wherein:
   a thickness of the second metal layer is in a range of approximately 2000-5000 Å.

7. The method according to claim 1, wherein:
the first metal layer is also formed over the bottom of the opening; and
the second metal layer is also formed over the dielectric layer.

8. The method according to claim 1, wherein a planarization process includes:
performing a first planarization process to remove the second metal layer formed over the dielectric layer;
performing a second planarization process to remove the first metal layer formed over the dielectric layer until the top surface of the liner structure layer is exposed; and
performing a third planarization process until the top surface of the remaining second metal layer and the top surface of the dielectric layer are flush.

9. The method according to claim 8, wherein the first planarization process also includes:
removing a part of thickness of the first metal layer formed over the dielectric layer, such that the thickness of the first metal layer formed over the dielectric layer reaches a preset thickness.

10. The method according to claim 9, wherein:
the preset thickness is in a range of approximately 300-1000 Å.

11. The method according to claim 8, wherein one or more processes in the first planarization process, the second planarization process and the third planarization process include:
a chemical mechanical polishing process.

12. The method according to claim 11, wherein, during the first planarization process performed by the chemical mechanical polishing process:
a pressure is larger than 1.5 Pa; and
a hardness of the polishing pad is in a range of approximately 80-100 MPa.

13. The method according to claim 11, wherein, during the second planarization process performed by the chemical mechanical polishing process:
a pressure is in a range of approximately 1-2 Pa; and
a hardness of the polishing pad is in a range of approximately 20-40 MPa.

14. The method according to claim 11, wherein, during the third planarization process performed by the chemical mechanical polishing process:
a pressure is in a range of approximately 1-2 Pa; and
a hardness of the polishing pad is in a range of approximately 20-40 MPa.

15. The method according to claim 1, after providing the substrate and before forming the first metal layer, further including:
forming a liner structure layer over the bottom and side surfaces of the opening, wherein the first metal layer is formed on the liner structure layer in the opening.

16. The method according to claim 15, wherein, along a direction away from the substrate, the liner structure layer sequentially includes:
a barrier layer;
a work function layer; and
an adhesive layer.

17. The method according to claim 16, wherein:
the barrier layer includes a tantalum nitride layer;
the work function layer includes a titanium aluminum layer, an aluminum nitride layer, and a titanium layer sequentially formed on the barrier layer; and
the adhesive layer is made of the same material as the first metal layer.

18. The method according to claim 1, after providing the substrate and before forming the first metal layer, further including:
forming a gate dielectric layer covering the bottom of the opening.

19. The method according to claim 1, wherein:
the second metal layer is enveloped by the first metal layer in the opening.

20. The method according to claim 1, wherein:
the second metal layer has an electrical conductivity higher than the first metal layer.

* * * * *